US011956928B1

(12) United States Patent
Taylor et al.

(10) Patent No.: US 11,956,928 B1
(45) Date of Patent: Apr. 9, 2024

(54) DATA CENTER COOLING

(71) Applicant: Core Scientific, Inc., Bellevue, WA (US)

(72) Inventors: Jacob Taylor, Los Altos, CA (US); Thomas Middleton Rutledge Fuller, Seattle, WA (US); Lawrence Kom, Redmond, WA (US)

(73) Assignee: Core Scientific Operating Company, Bellevue, WA (US)

( * ) Notice: Subject to any disclaimer, the term of this patent is extended or adjusted under 35 U.S.C. 154(b) by 260 days.

(21) Appl. No.: 17/476,786

(22) Filed: Sep. 16, 2021

Related U.S. Application Data

(60) Provisional application No. 63/079,174, filed on Sep. 16, 2020.

(51) Int. Cl.
*H05K 7/20* (2006.01)
*F24F 7/06* (2006.01)

(52) U.S. Cl.
CPC ........... *H05K 7/20745* (2013.01); *F24F 7/06* (2013.01); *H05K 7/20145* (2013.01)

(58) Field of Classification Search
CPC ........... H05K 7/20745; H05K 7/20145; H05K 7/20736; H05K 5/0213; H05K 7/18; H05K 7/20709; H05K 7/2079; H05K 7/1497; H05K 7/20718; G06F 1/20
USPC .................................................. 361/679.49
See application file for complete search history.

(56) References Cited

U.S. PATENT DOCUMENTS

| | | | |
|---|---|---|---|
| 3,655,054 A * | 4/1972 | Pansini | C02F 1/686 422/282 |
| 4,627,470 A | 12/1986 | Carruthers | |
| 6,616,524 B2 | 9/2003 | Storck, Jr. et al. | |
| 6,896,612 B1 * | 5/2005 | Novotny | H05K 7/20781 361/691 |
| 7,656,664 B2 * | 2/2010 | Ye | H05K 7/20154 361/691 |
| 9,644,858 B2 | 5/2017 | Pinkalla et al. | |
| 2006/0176664 A1 * | 8/2006 | Casebolt | G06F 1/20 361/679.48 |
| 2007/0165377 A1 * | 7/2007 | Rasmussen | H05K 7/2079 361/695 |
| 2010/0144265 A1 * | 6/2010 | Bednarcik | H05K 7/20745 454/184 |
| 2011/0288664 A1 * | 11/2011 | Archibald | G06F 1/206 454/184 |
| 2012/0037353 A1 * | 2/2012 | Coors | H05K 7/20745 138/40 |

(Continued)

*Primary Examiner* — Mandeep S Buttar

(57) ABSTRACT

A facility (e.g., data center) for more efficient cooling of computing devices is disclosed. In one embodiment, the data center comprises a set of external walls, a ceiling connected to the external walls and having circular exhaust openings, and one or more pods positioned within the external walls and below the ceiling. A set of flexible tubes are used to connect the pod exhaust openings to the ceiling openings. Actuating closures may be used (e.g., at one end of each of the tubes) to control airflow, and air pressure sensors may be placed near or inside one or more of the tubes. A controller may be configured to receive air pressure data from the air pressure sensors and adjust the actuating closures to maintain a desired air pressure level. In some examples, the actuating closure may have a normally closed position when power is not applied.

20 Claims, 12 Drawing Sheets

(56) References Cited

U.S. PATENT DOCUMENTS

2015/0345823 A1* 12/2015 Pinkalla ............. F24F 13/0218
138/119

* cited by examiner

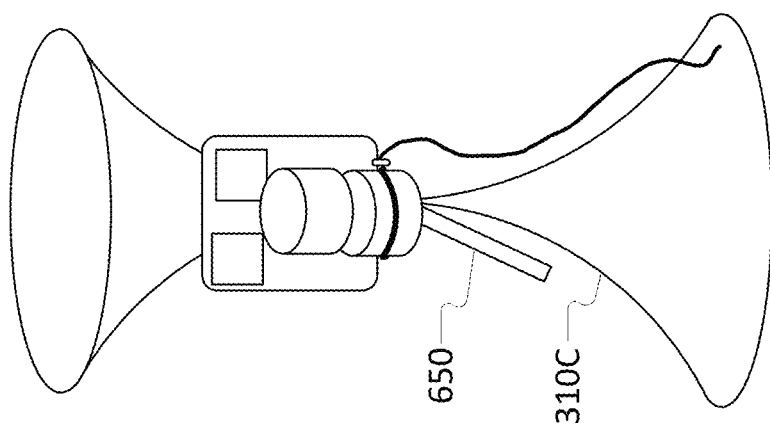
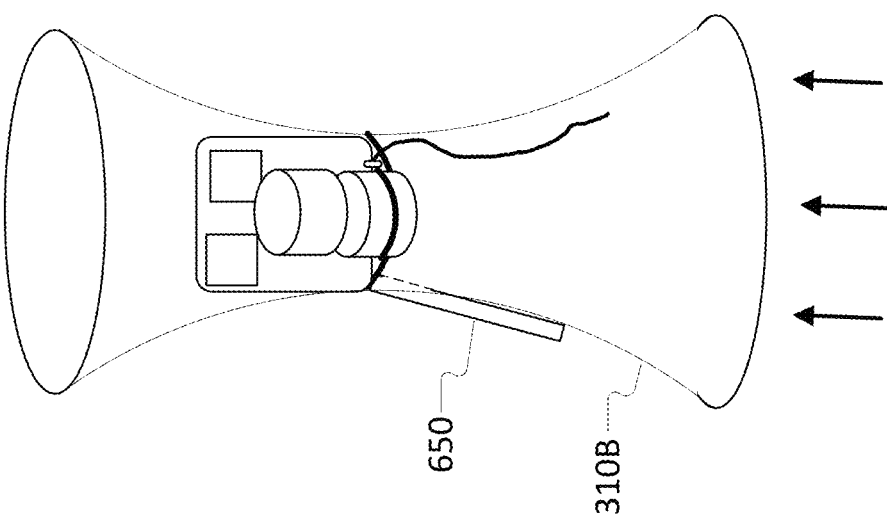
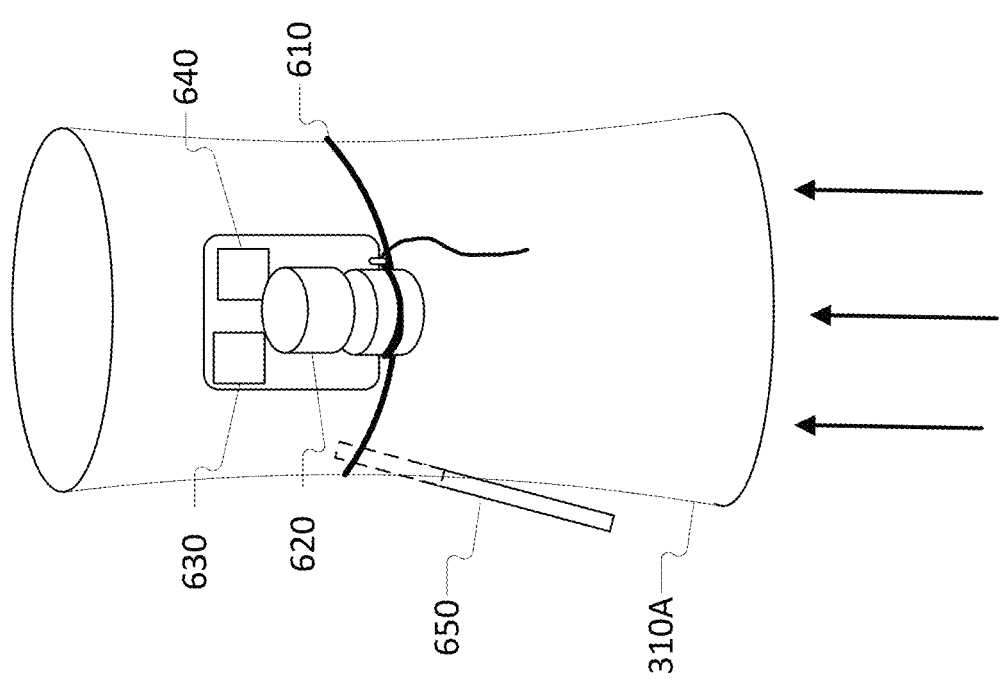

DATA CENTER COOLING

CROSS-REFERENCE TO RELATED APPLICATIONS

This application claims the benefit of, and priority to, U.S. Provisional Application Ser. No. 63/079,174, filed Sep. 16, 2020, the disclosure of which is hereby incorporated herein by reference in its entirety and for all purposes.

TECHNICAL FIELD

The present disclosure generally relates to the field of computing and, more particularly, to systems and methods for cooling large numbers of computing devices in a data center.

BACKGROUND

This background description is set forth below for the purpose of providing context only. Therefore, any aspect of this background description, to the extent that it does not otherwise qualify as prior art, is neither expressly nor impliedly admitted as prior art against the instant disclosure.

Many blockchain networks (e.g., those used for cryptocurrencies like Bitcoin) require computationally difficult problems to be solved as part of the hash calculation. The difficult problem requires a solution that is a piece of data which is difficult (costly, time-consuming) to produce, but is easy for others to verify and which satisfies certain requirements. This is often called "proof of work". A proof of work (PoW) system (or protocol, or function) is a consensus mechanism. It deters denial of service attacks and other service abuses such as spam on a network by requiring some work from the service requester, usually meaning processing time by a computer.

Participants in the network operate standard PCs, servers, or specialized computing devices called mining rigs or miners. Because of the difficulty involved and the amount of computation required, the miners are typically configured with specialized components that improve the speed at which mathematical hash functions or other calculations required for the blockchain network are performed. Examples of specialized components include application specific integrated circuits (ASICs), field programmable gate arrays (FPGAs), graphics processing units (GPUs) and accelerated processing unit (APUs).

Miners are often run for long periods of time at high frequencies that generate large amounts of heat. Even with cooling (e.g., high speed fans), the heat and constant operation can negatively impact the reliability and longevity of the components in the miners. ASIC miners for example have large numbers of hashing chips (e.g., 100's) that are more likely to fail as temperatures rise.

Many participants in blockchain networks operate large numbers (e.g., 100's, 1000's or more) of different miners (e.g., different generations of miners from one manufacturer or different manufacturers) concurrently in large data centers. Many data centers face cooling challenges, and data centers housing large numbers of miners or other CPU- or GPU-based systems used for compute intensive workloads (e.g., rendering, AI, machine learning, scientific simulation, data science) have even greater cooling challenges. This is due to the significantly higher density, power usage, heat generation, and duty cycle common to these devices and workloads.

The heat in data centers can often exceed the cooling ability of a computing device's built-in fans, which force air across heat sinks on the computing device in order to extract and exhaust the waste heat. Traditional methods for improving cooling of computing devices in data centers include mixing in refrigerated air to reduce the temperature of the air that is forced across the computing device by its built-in cooling fans. A significant drawback to this approach is that refrigeration uses significant amounts of energy on top of the energy already used by the computing devices themselves.

For at least these reasons, there is a desire for a more energy efficient solution to allow for improved efficient cooling and thermal management of computing devices in a data center.

SUMMARY

Improved systems and methods for cooling and thermal management of a plurality of computing devices in a data center are contemplated. In particular, a facility (e.g., data center) for more efficient cooling of computing devices is contemplated. In one embodiment, the data center comprises a set of external walls, a ceiling connected to the external walls and having circular exhaust openings, and one or more pods positioned within the external walls and below the ceiling. A set of flexible fabric tubes are used to connect the pod exhaust openings to the ceiling openings. In many instances, flexible fabric tubes are easier to install and less expensive than traditional sheet metal ducts and more forgiving of misalignment between plan drawings and actual openings, are more tolerant of seismic events, and may provide better airflow because they have fewer seams. Having multiple smaller exhaust openings with flexible fabric tubes permits easier routing around building obstacles such as support columns and beams. An actuating closure may be used (e.g., inside or at one end of each of the tubes) to control airflow, and air pressure sensors may be placed near or inside one or more of the tubes for monitoring. A controller may be configured to receive air pressure data from the air pressure sensors and adjust the actuating closure to maintain a desired air pressure level even when the computing devices' fan speed is changed. Maintaining proper air pressure levels may dramatically improve the cooling efficiency of the data center.

To prevent debris from entering the vent or the pod, a mesh may be included to seal one or both ends of each of the tubes. In some embodiments, covers may be attached atop each of the tubes. The covers may be configured to deflect rainwater from entering the tubes while permitting exhaust air to escape.

The ceiling openings and exhaust openings may be arranged in a two-dimensional array and may be offset from one another (e.g., horizontally and vertically). A drainpipe may be connected to each of the tubes to permit water captured in the tubes to drain out of the tubes.

An airflow guide may also be used in the pod to assist in directing exhaust air into the tubes and out of the facility. The airflow guide may for example have two opposite curved surfaces facing the exhaust fans of the computing devices. The airflow guide may be movable and separable into two halves that are stackable to permit easier maintenance of the pod.

The data center may also comprise one or more airflow indicators (e.g., an electronic network-enabled airflow sensor or a flag or streamer that can be visually monitored with a camera). These may for example be installed on each surface of the airflow guide.

To further improve airflow and direct exhaust air to the nearest exhaust tube, the computing devices may be positioned at angles (e.g., horizontal, vertical, or both) relative to perpendicular from the nearest wall.

The foregoing and other aspects, features, details, utilities, and/or advantages of embodiments of the present disclosure will be apparent from reading the following description, and from reviewing the accompanying drawings.

BRIEF DESCRIPTION OF THE DRAWINGS

FIG. 7A-C are side views of a flexible cooling duct usable in different levels of cinching according to the teachings of the present disclosure.

DETAILED DESCRIPTION

Reference will now be made in detail to embodiments of the present disclosure, examples of which are described herein and illustrated in the accompanying drawings. While the present disclosure will be described in conjunction with embodiments and/or examples, it will be understood that they do not limit the present disclosure to these embodiments and/or examples. On the contrary, the present disclosure covers alternatives, modifications, and equivalents.

Various embodiments are described herein for various apparatuses, systems, and/or methods. Numerous specific details are set forth to provide a thorough understanding of the overall structure, function, manufacture, and use of the embodiments as described in the specification and illustrated in the accompanying drawings. It will be understood by those skilled in the art, however, that the embodiments may be practiced without such specific details. In other instances, well-known operations, components, and elements have not been described in detail so as not to obscure the embodiments described in the specification. Those of ordinary skill in the art will understand that the embodiments described and illustrated herein are non-limiting examples, and thus it can be appreciated that the specific structural and functional details disclosed herein may be representative and do not necessarily limit the scope of the embodiments.

Figure 1:
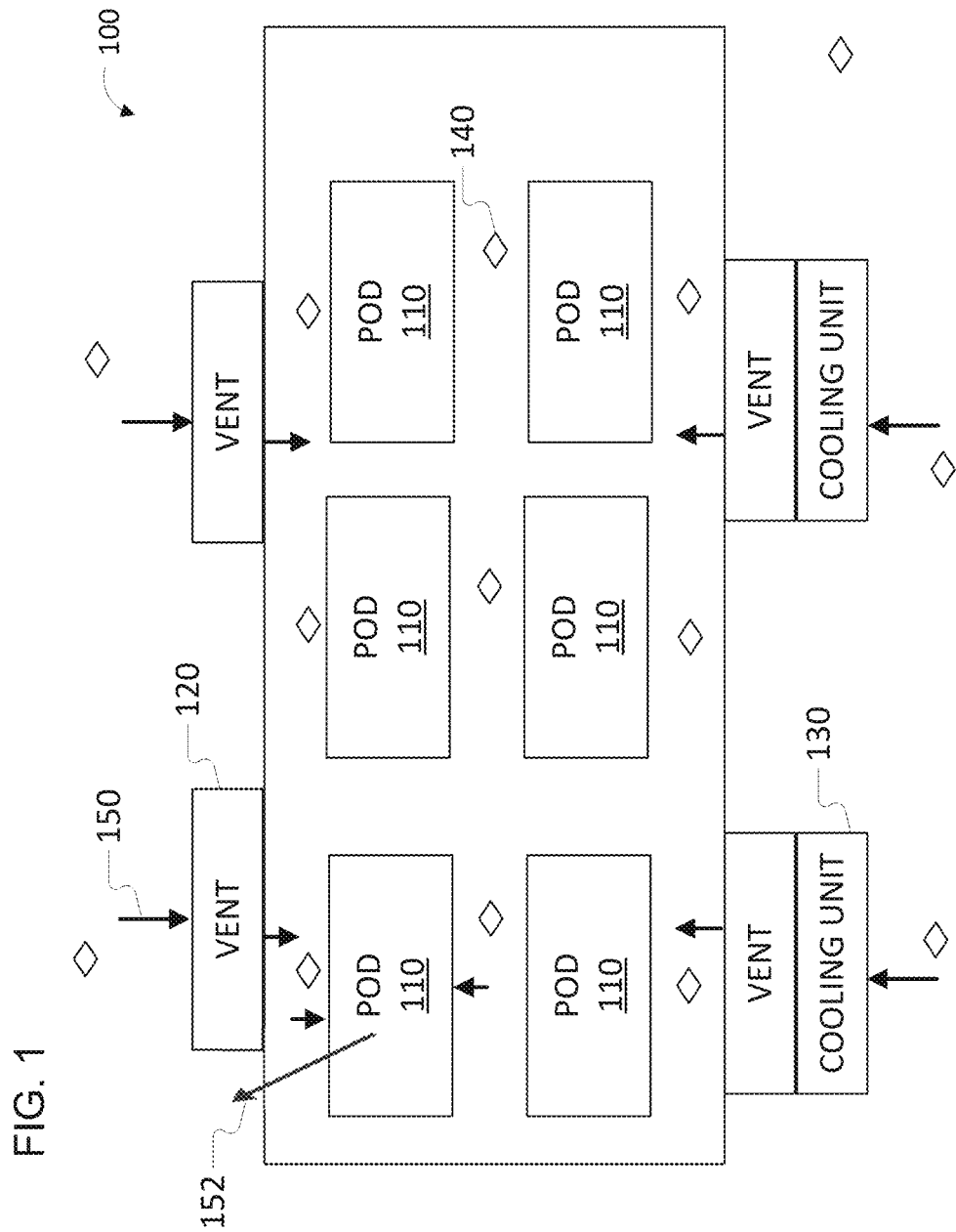
FIG. 1 is a top-down view of one example embodiment of a data center for computing devices.

Referring now to FIG. 1, a top-down view of one example of a data center 100 for computing devices is shown. The data center 100 is configured with a large number of pods 110. Pods are standardized blocks of racks, either in a row or (more typically) a pair of rows that share some common infrastructure elements like power distribution units, network routers/switches, containment systems, and air handlers. For example, a pod may have two parallel racks of devices, spaced apart and each facing outwards. The devices on the racks may all be oriented to pull cool air in from outside the pod and discharge the hot air (heated by the computing devices) into the empty space in the center of the pod where the hot air then rises up and out of the data center. For example, there may be one or more exhaust openings (e.g., positioned above the center of each pod) to capture the hot waste air and then discharge it out of the data center via vents in the roof of the data center.

Cool air is drawn into the data center 100 through vents (e.g., vent 120) indicated by arrow 150. The vents are adjustable (e.g. via dampers or louvers) so that airflow can be controlled (e.g., restricted or blocked) as needed. Once the air is inside data center 100, it is drawn into pods 110 and then expelled out of the data center via an exhaust opening (e.g., out the top and middle of pod 110 as indicated by arrow 152). A number of environmental sensors 140 may be located both inside and outside the data center. These sensors are network-enabled (e.g., wireless) and provide various environmental data such as temperature, humidity, barometric pressure, wind speed, wind direction, and solar radiation levels (e.g., cloudiness). A subset of these sensors may be located inside the data center, for example, in the cold aisles (also known as cool aisles) where cold air is drawn into the pods 110. Another subset of the pods may be located outside the data center 100, e.g., on different sides of the data center near each air intake vent. This enables the sensors to record environmental data that may vary on the different sides of the data center. For example, at certain times of the day temperatures on one side of the data center may be higher than temperatures on another side of the data center. This may be due to the angle of the sun striking that area outside the data center, or due to shade from nearby trees or structures. In these cases, it may be beneficial to open the vents on the cooler side of the data center and close the vents on the hotter side of the data center.

Some of the external air vents may have an associated cooling unit 130 that may be turned on as needed to reduce the temperature of the incoming outside air. For example, these may include refrigerated air units or misters or humidifiers that can be turned on during particularly hot days when the outside air is too warm to effectively cool the computing devices in pods 110.

In some embodiments, the volume of air inside data center 100 may be significant (much larger than shown in the figure). In these embodiments, there may be a significant delay in the change in air temperature of the air entering a pod relative to a change in the air temperature entering a vent 120. Depending on the configuration of the data center 100, significant mixing of the internal and external air may occur before being drawn into pod 110. Some data centers may be configured with baffles or adjustable vents and fans to encourage this mixing. By placing a number of environmental sensors 140 in different locations in data center 100, this mixing and progression of air temperatures maybe tracked over time.

Figure 2:
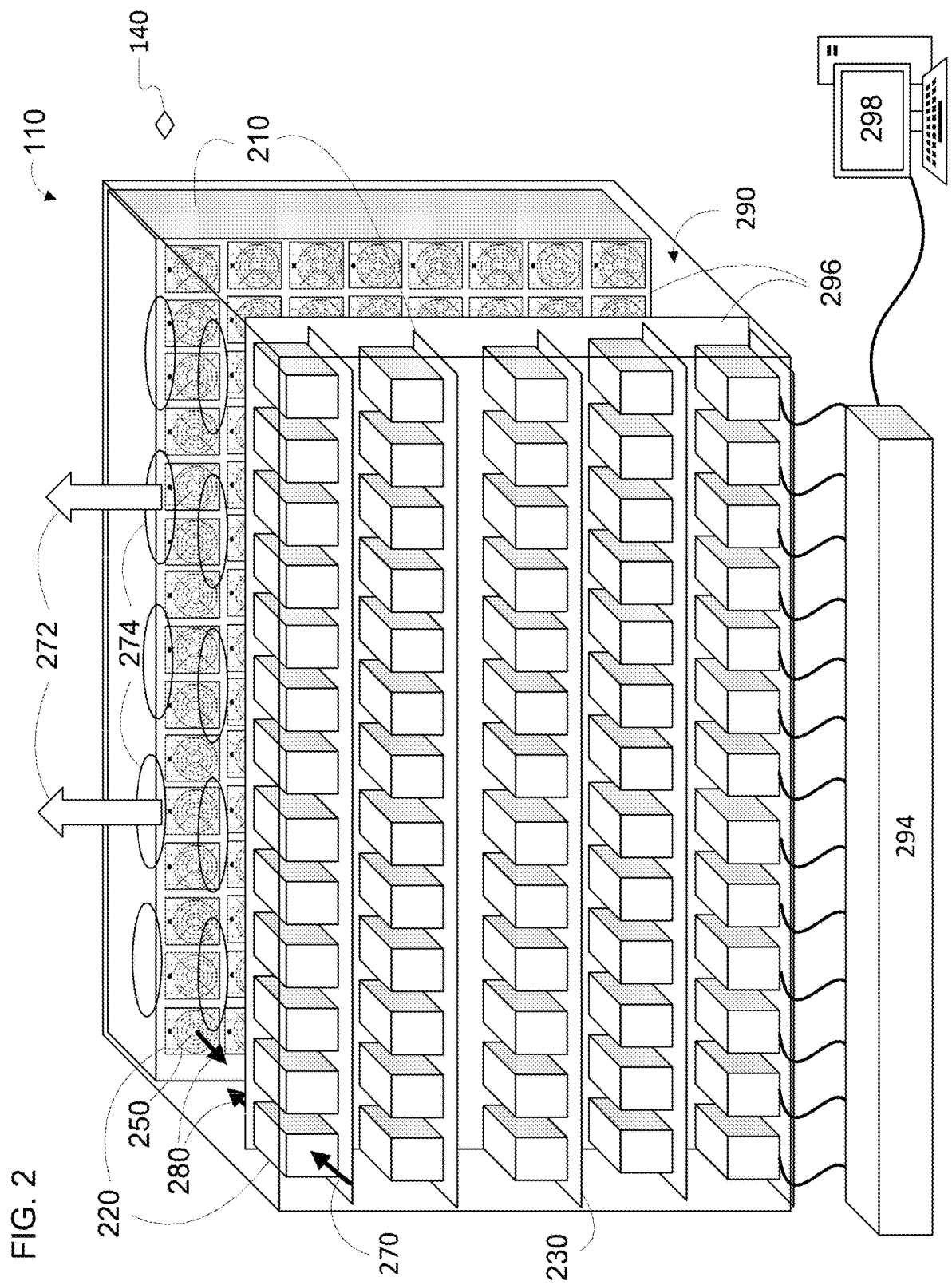
FIG. 2 is a perspective view of one example embodiment of a pod housing computing devices in a data center according to the teachings of the present disclosure.

Turning now to FIG. 2, a perspective view of one example of a pod 110 is shown. This example of pod 110 has racks 210 that each have a number of shelves 230 for holding computing devices 220, thereby creating a two-dimensional array of computing devices on each rack or group of racks. In other embodiments, racks 210 may have rails that hold computing devices 220 in place of shelves 230. Each computing device 220 has one or more cooling fans 250 configured to draw air from outside the pod into the computing device for cooling, as shown by arrow 270. The moving air draws heat from computing device 220 and is exhausted from the computing device as shown by arrows 280.

In some embodiments, computing device 220 may have two fans, one on the intake side and one on the exhaust side. In other embodiments multiple smaller fans may be used in parallel, series or a combination of parallel and series within computing device 220. Heated air is exhausted by computing devices 220 into the space 290 between racks 210, often called a hot aisle. The space between racks 210 is typically sealed except for one or more exhaust openings 274 through which the heated air exits. In some embodiments, these openings may be at the side, but more commonly these exhaust openings are located at the top of hot aisle 290 with the heated air exiting above the pod as indicated by arrows 272. In some embodiments, computing devices 220 are positioned adjacent to an air barrier 296 with openings large enough to allow the heated exhaust air from each computing device 220 to pass into hot aisle 290 but not escape out of hot aisle 290 other than through the exhaust openings 274.

Computing devices 220 are networked together with network switch 294 and may be organized by mapping physical computing device positions within the pod, rack and shelf by the network ports on switch 294. This network connection allows management instructions and computing jobs to be sent to each computing device 220, and data such as device status information (e.g., temperature information provided from one or more temperature sensors on each computing device) and results of the computing jobs to be returned. Switch 294 may also be connected to other networks such as the internet, as well as a management computer 298 that is configured to execute a management application to manage computing devices 220. Management computer 298 may be a traditional PC, a server (bare metal or virtual) or a specialized appliance. Management computer 298 may be configured with one or more processors, volatile memory and non-volatile memory such as flash storage or internal or external hard disk (e.g., network attached storage). The management application is preferably implemented in software (e.g., instructions stored on a non-volatile storage medium such as a hard disk, flash drive, or DVD-ROM), but hardware implementations are possible. Software implementations of the management application may be written in one or more programming languages or combinations thereof, including low-level or high-level languages, with examples including Java, Ruby, JavaScript, Python, C, C++, C #, or Rust. The program code may execute entirely on the management computer 298 as a stand-alone software package, partly on the management computer 298 and partly on a remote computer or computing devices 220, or entirely on a remote computer or computing devices 220.

While different computing devices 220 will have different interfaces for setting fan speed, one example is that the computing device will have a network port open that will accept management commands such as setting the fan speed, voltage level, operating frequency, etc. In order to better cool computing devices 220, the management application may be configured to monitor temperature and other environmental conditions and make adjustments to computing device settings and data center operational settings. For example, the management application may be configured to change external air vent settings (open or close them) and or send instructions that cause computing devices 220 to temporarily change their fan speeds and or operating frequencies. The management application may also reduce the amount of work dispatched to some of the computing devices that are likely to experience higher temperatures (e.g., idling them or reducing their duty cycle to reduce heat generated).

The management application may also provide a user interface for users to configure and control computing devices 220. For example, the management application may be configured to permit the user to specify device configuration settings (e.g., maximum and minimum desired temperatures, voltages, operating frequencies and fan speeds). With this information the management application may then monitor the status (e.g., device temperature, fan speed, operating frequency and voltage) of each computing device associate that data with the device's location in the data center. This data can then be used to populate a model of the environment in the data center.

In addition to the temperature data from computing devices 220, the management application may also be configured to periodically read (and store into a database) environmental data from sensors 140 located inside and outside the data center. The environmental data collected may be tagged with a timestamp and the location information of the sensor or computing device generating the data. While the illustrated examples show the computing devices 220 arranged in two-dimensional arrays that are planar and perpendicular to the floor, other arrangements are possible and contemplated.

Figure 3:
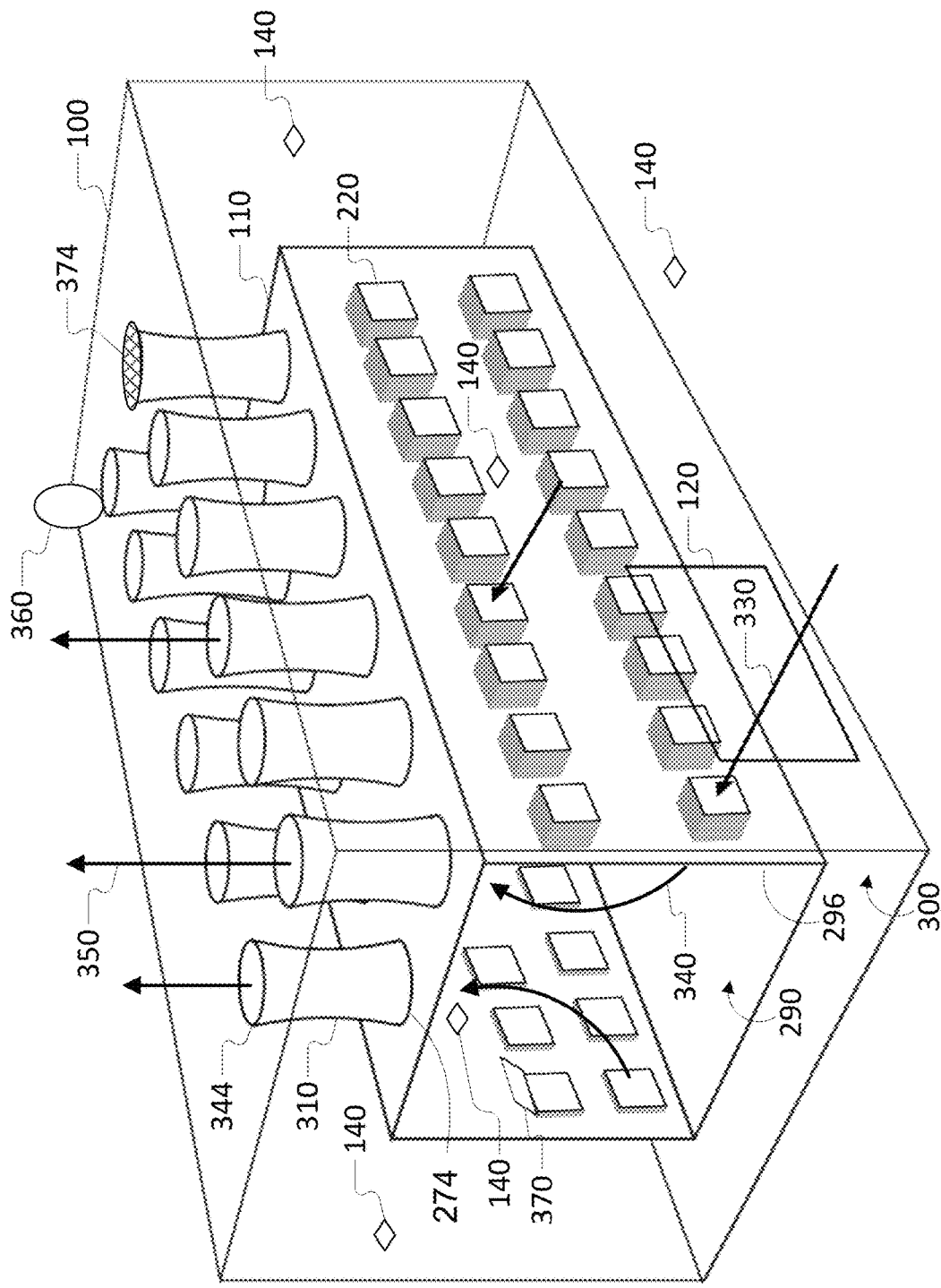
FIG. 3 is a perspective view of another example embodiment of a pod housing computing devices in a data center according to the teachings of the present disclosure.

Turning now to FIG. 3, a perspective view of another example embodiment of a pod 110 housing computing devices in a data center 100 according to the teachings of the present disclosure is shown. In this embodiment, computing devices 220 are mounted on racks (not shown in this figure for illustration purposes) and positioned so that they exhaust their heat into hot aisle 290. Cool outside air is drawn into the data center 100 through air intake vent 120 as shown by arrow 330. The cool air flows through air intake vent 120 into cold aisle 300. The cool air is then drawn into computing devices 220 by cooling fans that are part of each computing device 220. Heat sinks within computing devices 220 draw heat from the processors in computing devices 220 and transfer the heat to the air which is then expelled into hot aisle 290. Computing devices 220 are mounted on racks and positioned to expel their waste heat into hot aisle 290. Computing devices 220 maybe positioned and sealed against air barrier 296 to ensure that little or no waste heat escapes back into the cold aisle 300. Air barrier may be constructed of insulated panels that have enough rigidity and strength to withstand the high temperatures and air pressure differential between the hot aisle and cold aisle. For example, plywood or corrugated sheet metal with insulating foam sheets attached may be used.

The hot aisle may have one or more ceiling exhaust openings 274 that are connected to external exhaust openings 344 in the roof of the data center by one or more exhaust tubes 310. While shown without an end wall for illustration purposes, hot aisle 290 may be sealed other than the openings for the computing devices' exhaust and ceiling exhaust openings 274. While traditional data centers utilize traditional sheet metal ductwork to vent pods, this embodiment uses flexible ducts (e.g., cylindrical ducts made from fabric) to improve the flow of exhaust air out of the data center.

The heated air is at a higher air pressure in the hot aisle from the fans in computing devices 220 and is forced out of the hot aisle 290 and through the exhaust tubes 310 by that pressure as shown by arrows 340 and 350. Significant pressure can be generated as a result of the large number of fans all blowing hot exhaust air into hot aisle 290, so the flexible ducts should be thick enough or reinforced with fibers or cords so that they can withstand the high air pressures and high temperatures.

The exhaust tubes 310 may be configured with a mesh 374 to prevent birds or debris such as blowing leaves from falling into the hot aisle. The exhaust tubes 310 may also be configured with a movable cover 360 (e.g., a single cover or multiple smaller flaps forming a full cover) that can be closed when not in use (e.g., when fewer exhaust openings are needed to maintain a desired air pressure in hot aisle 290 or when the computing devices are turned off for repairs).

Environmental sensors 140 may be positioned outside and inside the data center, including in cold aisle 300 and in hot aisle 290 near ceiling exhaust openings 274 (e.g., to monitor air pressure at one or more of the openings of exhaust tubes 310). As described in greater detail below, in some embodiments, some or all of computing devices 220 may be fitted with an air deflector 370 to improve air flow by guiding the exhaust air to the nearest exhaust opening.

Figure 4:
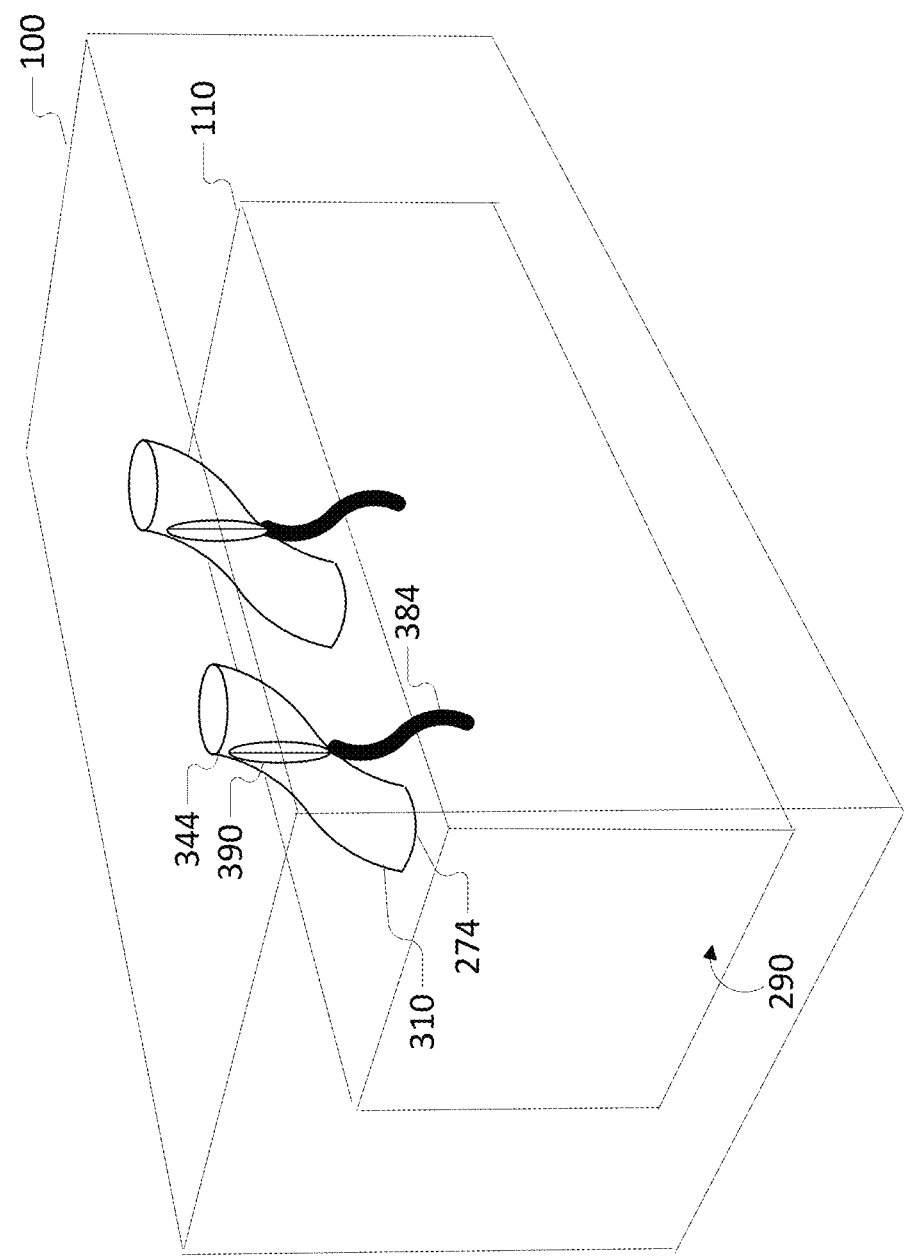
FIG. 4 is a perspective view of another example embodiment of a pod in a data center according to the teachings of the present disclosure.

Turning now to FIG. 4, another embodiment of a pod 110 in data center 100 for cooling computing devices is shown. In this embodiment, exhaust tubes 310 are connected at an offset (i.e., the exhaust opening 274 from the hot aisle 290 and the ceiling opening 344 in data center 100 are not aligned vertically/horizontally). By being offset, exhaust tubes 310 may be routed around structural components of data center 100 (e.g. beams, water pipes, etc.) and may be positioned to have a bend designed to collect rainwater that can be drained with drain tubes 384. Exhaust tubes 310 may be fitted with a mesh filter 390 (e.g., made of vertical wires that act as a rain chain) that keeps out birds, debris, and directs rainwater down drain tubes 384.

Figure 5:
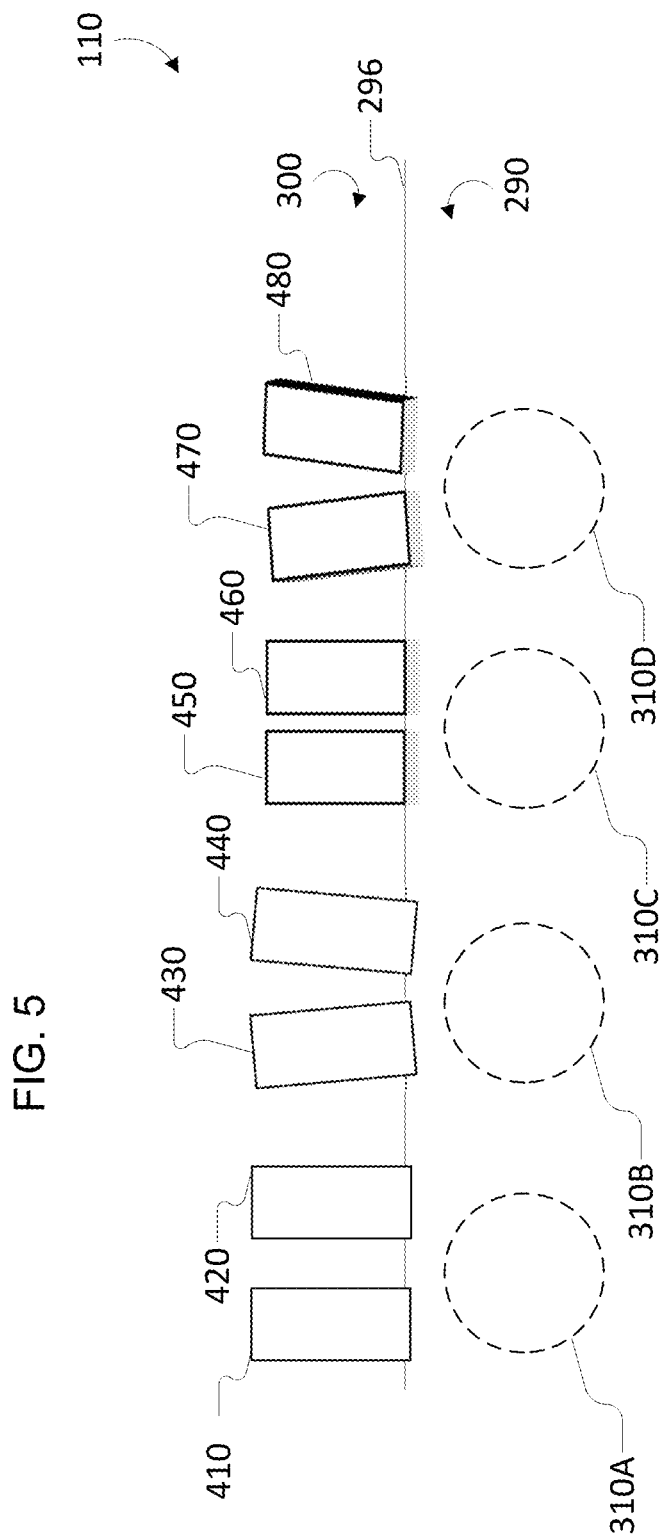
FIG. 5 is a top-down view of another embodiment of a portion of a pod housing computing devices in a data center according to the teachings of the present disclosure.

Turning now to FIG. 5, a top-down cross-section view of a portion of another embodiment of a pod 110 is shown. In this embodiment, computing devices 410-480 are positioned on racks against hot aisle barrier 296 so that they draw in air from cold aisle 300 and exhaust hot air into hot aisle 290. Four different positioning schemes are illustrated. Computing devices 410 and 420 are positioned perpendicular to hot aisle barrier 296. Computing devices 430 and 440 are positioned at an angle horizontally (relative to perpendicular to barrier 296) to better direct their exhaust air toward the nearest hot air exhaust tube 310B. Computing devices 450 and 460 are positioned at an angle vertically (relative to perpendicular to barrier 296) to better direct their exhaust air toward the nearest hot air exhaust vent 310C (as exhaust vents 310A-D are at the top of hot aisle 290, they are positioned higher than computing devices 410-480). Computing devices 470 and 480 are positioned at an angle both horizontally and vertically (relative to perpendicular to barrier 296) to better direct their exhaust air toward the nearest hot air exhaust vent 310D. By positioning computing devices at an angle, their exhaust air may be better directed to the closest exhaust vent, thereby improving air flow in the data center. While limitations in the computing device size and rack configurations may prevent large angles, even small angles as shown may improve overall airflow in some data center configurations. Even at an angle, computing devices 410-480 may be sealed to hot aisle barrier 296 to prevent hot air from leaking out of hot aisle 290 to cold aisle 300. For example, rubber or foam gaskets or plastic or sheet metal shims or frames designed to match the approximate size and position of the exhaust fan openings of the computing devices may be used to seal the computing devices to the hot aisle barrier and prevent hot air from escaping back into cold aisle 300.

Figure 6:
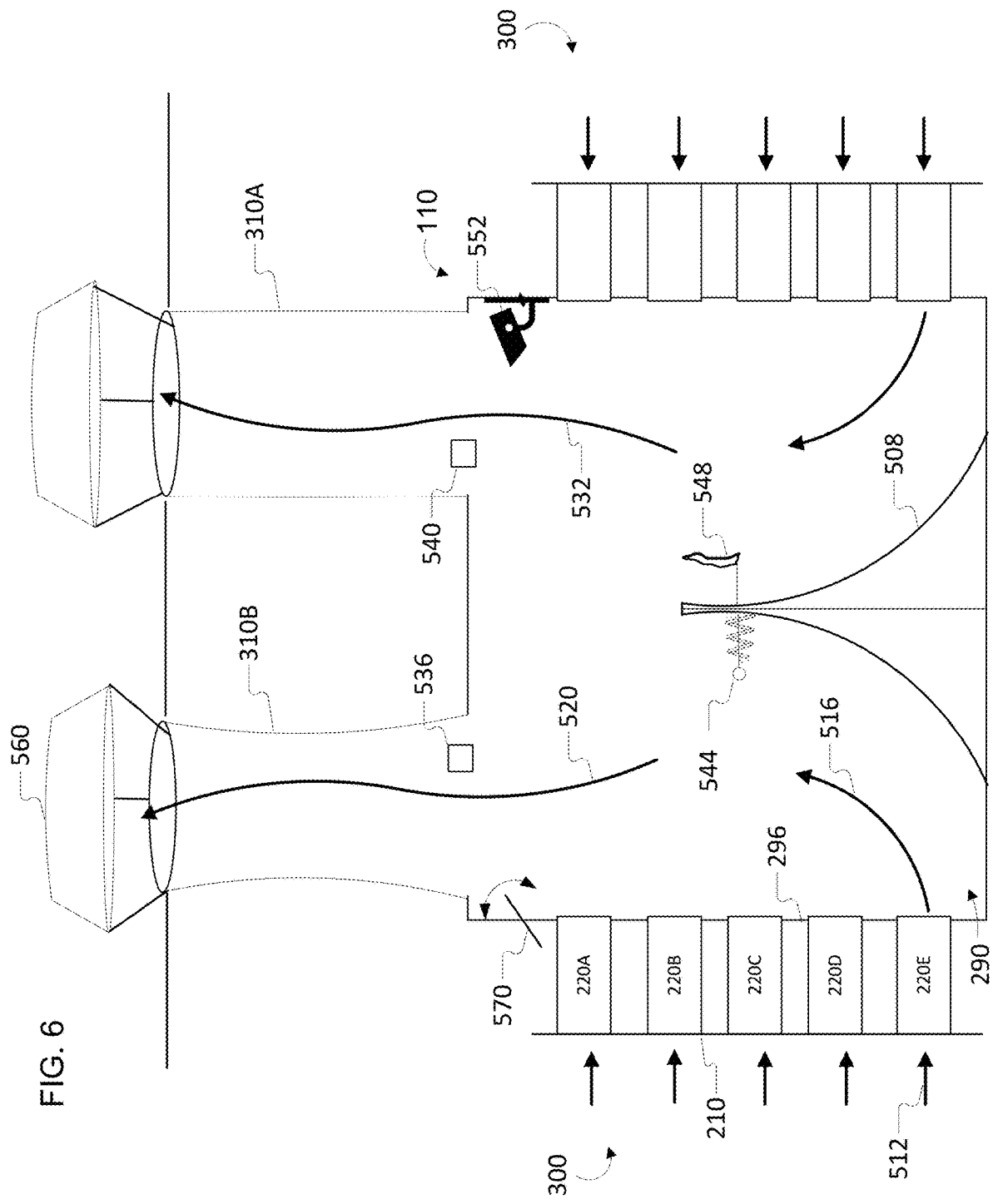
FIG. 6 is a side cross-section view of another embodiment of a pod housing computing devices in a data center according to the teachings of the present disclosure.

Turning now to FIG. 6, a side cross-section view of another embodiment of a pod 110 is shown. In this embodiment, computing devices 220A-E are mounted on rack 210 and draw cool air in from cold aisle 300 as shown by arrow 512 and exhaust hot air into hot aisle 290 as shown by arrow 516. With the large number of computing devices' exhaust fans all forcing hot exhaust air into hot aisle 290, the air pressure rises in hot aisle 290. This forces the hot air in hot aisle 290 out exhaust tubes 310A and 310B as shown by arrows 520 and 532. A cap 560 is installed on exhaust tubes 310A and 310B that permits the hot exhaust air to escape while keeping out rain and windblown debris.

Hot spots may occur in hot aisle 290 due to hot air moving more slowly in certain areas (e.g., due to the geometry of the aisle such as corners, uneven air pressure due to differences in computing devices' fan speeds, fan size and blade geometries, surface irregularities, etc.). In some embodiments, one or more air flow guides 508 may be used to improve the airflow in hot aisle 290 and to help reduce or eliminate these hot spots. Air flow guide 508 may be constructed of fabric (e.g., like exhaust tubes 310A and 310B) stretched over a wire frame, or it may be constructed of plywood, sheet metal, plastic, or other air impermeable material. In one embodiment, the air flow guide 508 may comprise two triangular halves with a curved hypotenuse for directing the air flow. A design having two halves can be more easily moved and stacked on each other in order to take up less space during maintenance operations in hot aisle 290 (often done with a scissor lift). Other geometries are possible and contemplated, including flat moveable walls that can be positioned at an angle relative to the floor or sides of the hot aisle 290.

In some embodiment, hot aisle 290 may be outfitted with one or more sensor, such as network enabled air speed and pressure sensors 536 and 540. These sensors may be monitored by a management application (e.g., via a wireless network) to detect undesirable air pressure levels or differentials in hot aisle 290 and exhaust tubes 310A and 310B. In place or, or in addition to sensors 536 and 540, one or more airflow indicators may also be used such as a streamer or flag 548. Beneficially, flags are low cost and can be placed in multiple locations throughout the hot aisle to assist in visualizing air flow. In some embodiments, one or more cameras 552 may be used to monitor the airflow indicators. The management application may be configured to monitor the images (e.g., digital video stream) from the camera 552 and automatically detect undesirable changes in airflow. In response, the management application may increase or decrease fan speed for one or more computing devices exhausting air into the hot aisle in order to dynamically improve airflow into and out of hot aisle 290. In addition, or as an alternative to flags or streamers, spring-loaded sensors 544 may also be used.

In some data center locations, it may be desirable or necessary to reclaim some of the hot air in hot aisle 290 (e.g., in winter to control temperature or humidity levels). Pod 110 or exhaust tubes 310 may be fitted with one or more heat recirculation vents 570 that permit a controllable amount of hot air from hot aisle 290 to be mixed back into the cold aisle 300.

Turning now to FIGS. 7A-C, three different configurations of one embodiment of a flexible exhaust tube 310 are shown. One benefit of using a flexible exhaust tube is that its diameter can be changed dynamically. In FIG. 7A, exhaust tube 310 is configured with a cord 610 that goes around the perimeter of exhaust tube 310A. Cord 610 may be a rope, a belt, a toothed belt, a chain, a strap or other tightening mechanism. The cord 610 is movably engaged with a motor 620 (e.g., via a sprocket, gear, pulley, wheel), and motor 620 can be energized to tighten or loosen cord 610 and correspondingly decrease or increase the diameter of the middle portion of exhaust tube 310. In other embodiments the motor can be a rotary or linear actuator. Motor 620 may be controlled directly by a computer or by a controller 630 (e.g., microcontroller) that can autonomously change the tube's diameters or can communicate with a management application (e.g., via a wired or wireless network) for central control. Central control allows the management application to gather data from many sources (e.g., computing device temperature sensors, internal and external data center environmental sensors, air pressure and speed sensors in hot aisle, cameras, and inside the exhaust tubes themselves) and make intelligent dynamic adjustments. In some embodiments machine learning and artificial intelligence algorithms may be used to predict when changes in air pressure are needed and when changes in exhaust tube diameters should be made.

In some embodiments, a pressure sensor 640 may be included in exhaust tubes 310 and connected to the controller 630. In other embodiments, a servo is used for motor 620 that is able to determine the tension on cord 610. The cord 610 may be encoded (e.g. with optically readable markings, indicators or a resistance strip), or a chain or toothed belt may be used permitting controller 630 to determine the current diameter of the exhaust tube 310.

In FIG. 7A, there is little to no tension on the cord 610, resulting in a full or near-full diameter of exhaust tube 310. As there is significant air pressure in exhaust tube 310A, without tension on cord 610 the flexible exhaust tube 310A will be pushed open to its maximum diameter. In FIG. 7B, there is some tension on the cord 610, resulting in an approximately 50% reduction in the diameter of exhaust tube 310B. In FIG. 7C, there is significant tension on cord 610, resulting in a complete or near-complete reduction in diameter of exhaust tube 310C (i.e., blocking the tube). This prevents air flow through exhaust tube 310C, which may be beneficial (e.g., when maintenance is being performed, or fewer computing devices are running).

In some embodiments, a cap as shown in previous figures may be used to prevent rain or wind-blown debris from entering the hot aisle. However, in many cases the air pressure and speed of air through exhaust tube 310 may be high enough to prevent any rain or birds from entering the hot aisle. If a cap is not used, it may be beneficial to have a drain pipe (e.g. hose or tube) 650 attached to exhaust tube 310C to permit any rainwater to drain out that accumulated in the exhaust tube 310C when the tube is closed as in FIG. 7C.

Figure 8:
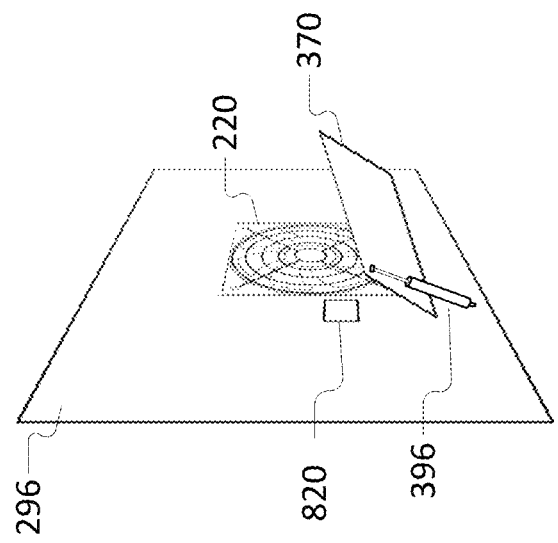
FIG. 8 is an illustration of one example embodiment of an air deflector according to the teachings of the present disclosure.

Turning now to FIG. 8, one embodiment of an air deflector 370 is shown. In this embodiment, the deflector 370 is configured to serve two purposes. First, the air deflector 370 is configured to assist in directing the hot exhaust air from computing device 220 to the nearest exhaust vent. Second, the air deflector 370 is configured to close when the fan of computing device 220 is not operating. In other embodiments the air deflector may be used for just one of these purposes. In one embodiment, deflector 370 may be configured to cover and seal a significant portion or all of computer device 220's exhaust opening when closed. This may be beneficial to prevent hot air from the hot aisle escaping back into the cold aisle through computing device 220. As there may be significant pressure in the hot aisle, this can easily happen when a device malfunctions (e.g., the device's power supply or fan stops working, or the device is removed from its rack position for inspection or maintenance).

In one embodiment, air deflector 370 may be configured with an adjustable strut or spring 396 to permit positioning against the force of exhaust air and to moderate the closing speed of air deflector 370 when computing device 220's exhaust fan stops. An electronic sensor 820 may also be used to detect when air deflector 370 is closed or at what angle the deflector is set to. The electronic sensor may also be network-enabled and may communicate with the management application. In some embodiments, a servo and microcontroller may be used in place of adjustable strut 396 to permit automated control (e.g., via the management application) of the position of the air deflector 370.

Figure 9A:
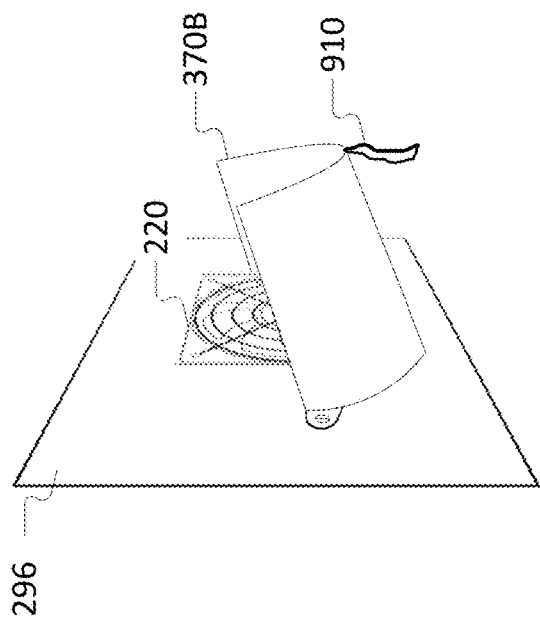
FIG. 9A-D are illustrations of additional example embodiments of an air deflector according to the teachings of the present disclosure.

Turning now to FIGS. 9A-9D, other embodiments of an air deflector are shown. In FIG. 9A, air deflector 370A comprises a flat deflector with adjustable side hinges 960 that are affixable to hot aisle air barrier 296 with fasteners through eyelets 950. This permits the angle of air deflector to be adjusted. In other embodiments, air deflector 370A may come in multiple version each having a different fixed angle.

Figure 9B:
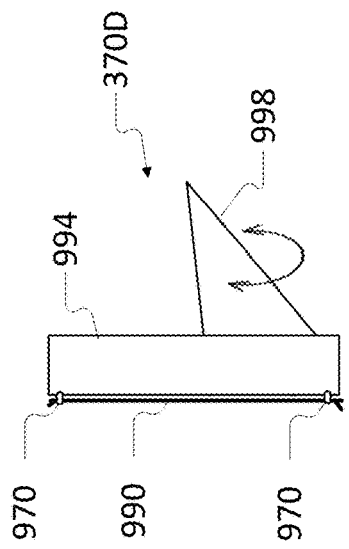

Turning now to FIG. 9B, another embodiment of air deflector 370B is shown. In this embodiment, air deflector 370B is a curved, partial cylinder. In some embodiments, a visual air direction and speed indicator such as a streamer or flag 910 may be affixed to the air deflector 370B. These may for example be monitored by a camera to determine undesirable or unexpected changes in air flow.

Figure 9C:
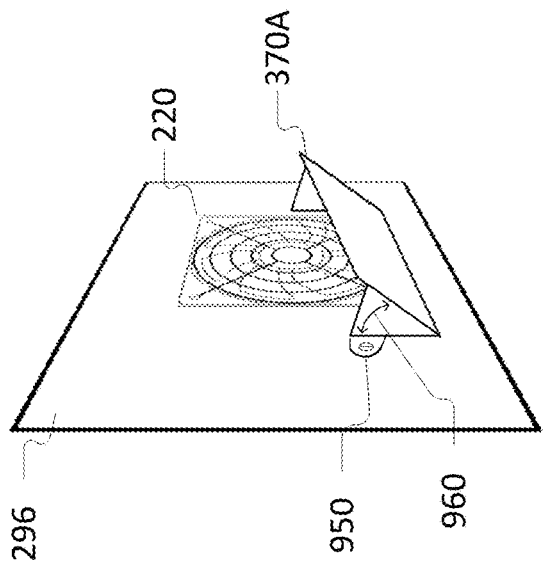

Turning now to FIG. 9C, yet another embodiment of air deflector 370C is shown. In this embodiment, air deflector 370C comprises clips 970 that permit the air deflector to be mounted directly to the exhaust fan grille 990 on computing device 220. In some embodiments, the clips may permit the angle (e.g., orientation) of the air deflector to be changed as shown in the figure.

Figure 9D:
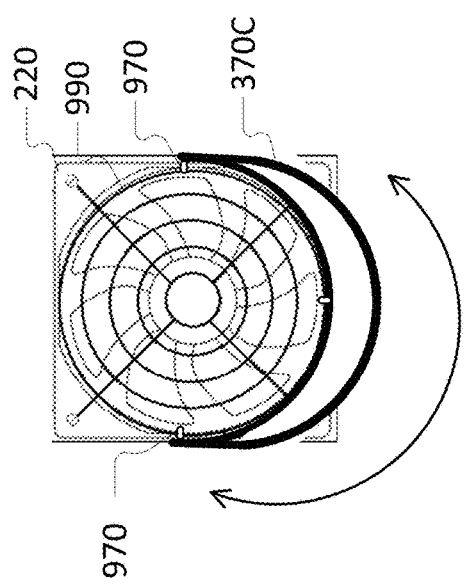

Turning now to FIG. 9D, a side view of yet another embodiment of air deflector 370D is shown. In this embodiment, the air deflector comprises two pieces, a fixed base 994 that clips to fan grille 990 as in the previous example, and a separate rotatable cylindrical member 998.

Figure 10:
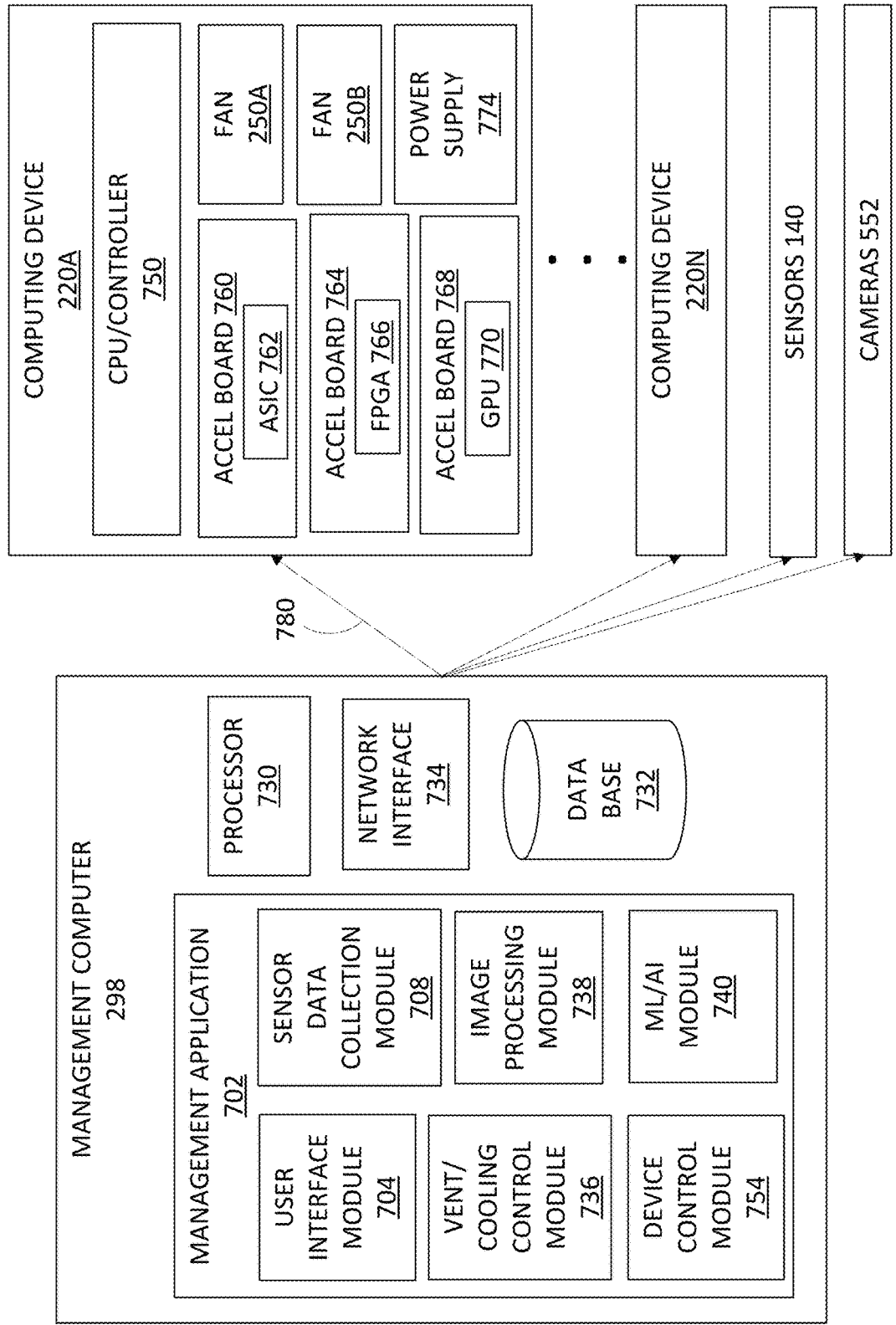
FIG. 10 is a diagram of a system for cooling computing devices in a data center according to the teachings of the present disclosure.

Turning now to FIG. 10, an illustration of an example embodiment of a system for efficiently cooling computing devices in a data center is shown. In this embodiment the system comprises a large number of computing devices 220A-N. The computing devices 220A-N communicate over a network 780 with a management computer 298 via the server's network interface 734. While wireless networks are possible, current computing device density in data centers means wired networks such as wired Ethernet are currently preferred for communications between management computer 298 and computing devices 220. In some embodiments, computing devices 220 may include a CPU or controller 750 and a network interface for communicating with management computer 298 via network 780. Controller 750 may be configured to send compute tasks to one or more accelerator/hash boards, such as ASIC accelerator board 760 having one or more ASICS 762, FPGA accelerator board 764 having one or more FPGAs 766, and GPU accelerator board 768 having one or more GPUs 770 that can operate at a frequency specified by the controller. Computing device 220A may further comprise multiple cooling fans 250A-B and a power supply 774. In some embodiments, the voltage output by the power supply to the accelerators may be varied based on settings configured by controller 750. Higher voltage and frequency levels will increase performance, but they may also increase heat and may negatively impact longevity.

Management computer 298 may be a traditional PC or server, or specialized appliance. Management computer 298 may be configured with one or more processors 730, volatile memory and non-volatile memory such as flash storage or internal or external hard disk (e.g., network attached storage). Management computer 298 is configured to execute a management application 702 to efficiently operate and cool the data center and to assist users (e.g., data center technicians) with managing computing devices 220. Management computer 298 may be located within the same data center or facility as computing devices 220 or located remotely and connected to computing devices 220 via the Internet (e.g., via VPN or SSH).

Management application 702 is preferably implemented in software (e.g., instructions stored on a non-volatile storage medium such as a hard disk, flash drive, or DVD-ROM), but hardware implementations are possible. Management application 702 may include a number of modules, including for example, a user interface module 704 that displays data to a user and receives input from a user (e.g., via an external display or via the user's web browser), a sensor data collection module 708 that is configured to read temperature, air speed and pressure, and other environmental data from sensors in the computing devices 220, and in sensors 140 installed in and around the data center. The data collected may be stored in database 732, which may be local to management computer 298, on another computer in the data center, or in a remote cloud service.

An image processing module 738 may be included in management application 702 to process data from one or more cameras 552 in the data center (e.g., cameras that capture images or video of air flow indicators in the hot aisles of the data center). The captured images may be compared with one or more reference images that show airflow indicators when the data center is operating optimally. A vent and cooling control module 736 may also be part of management computer 298, along with a computing device control module 754. Device control module 754 is configured to receive work items and distribute them to the computing devices 220, monitor the health of computing devices 220 (e.g., hash rates) and send instructions to change voltage, frequency, and fan speeds as needed. Vent and cooling control module 736 may be configured to monitor and adjust the vents in the data center, including external air intake vents, hot air reclamation vents, and hot aisle exhaust vents. If additional cooling is needed, e.g. refrigeration or misting, vent and cooling control module 736 may send instructions to turn on the corresponding cooling unit.

In some embodiments, management application 702 may be configured with a machine learning (ML) or artificial intelligence (AI) module 740 that monitors the data collected and stored in database 732 to determine correlations between environmental data such as temperature, humidity, air pressure, air flow, and computing device temperature. Once these correlations have been established, module 740 may predict the optimal adjustments to make to computing device fan speed and vent and exhaust tube settings for optimal cooling given the current and recent environmental sensor readings. In some embodiments, weather forecast data (e.g., from an internet weather service or API) may also be incorporated into the ML/AI correlation module 740.

The data collected by the modules in management computer 298 may be tagged by location and time stamp before they are stored into the database 732, which may then be accessed by ML/AI module 740 to create a correlation model that can be used to (i) predict the future impact of changes in environmental variables such as external temperature, humidity, wind speed, pressure and solar radiation measurements along with weather forecasts and (ii) how to mitigate them in the most efficient way (e.g., how much adjust to computing device fan speeds, computing device workloads, vent settings, etc.).

Figure 11:
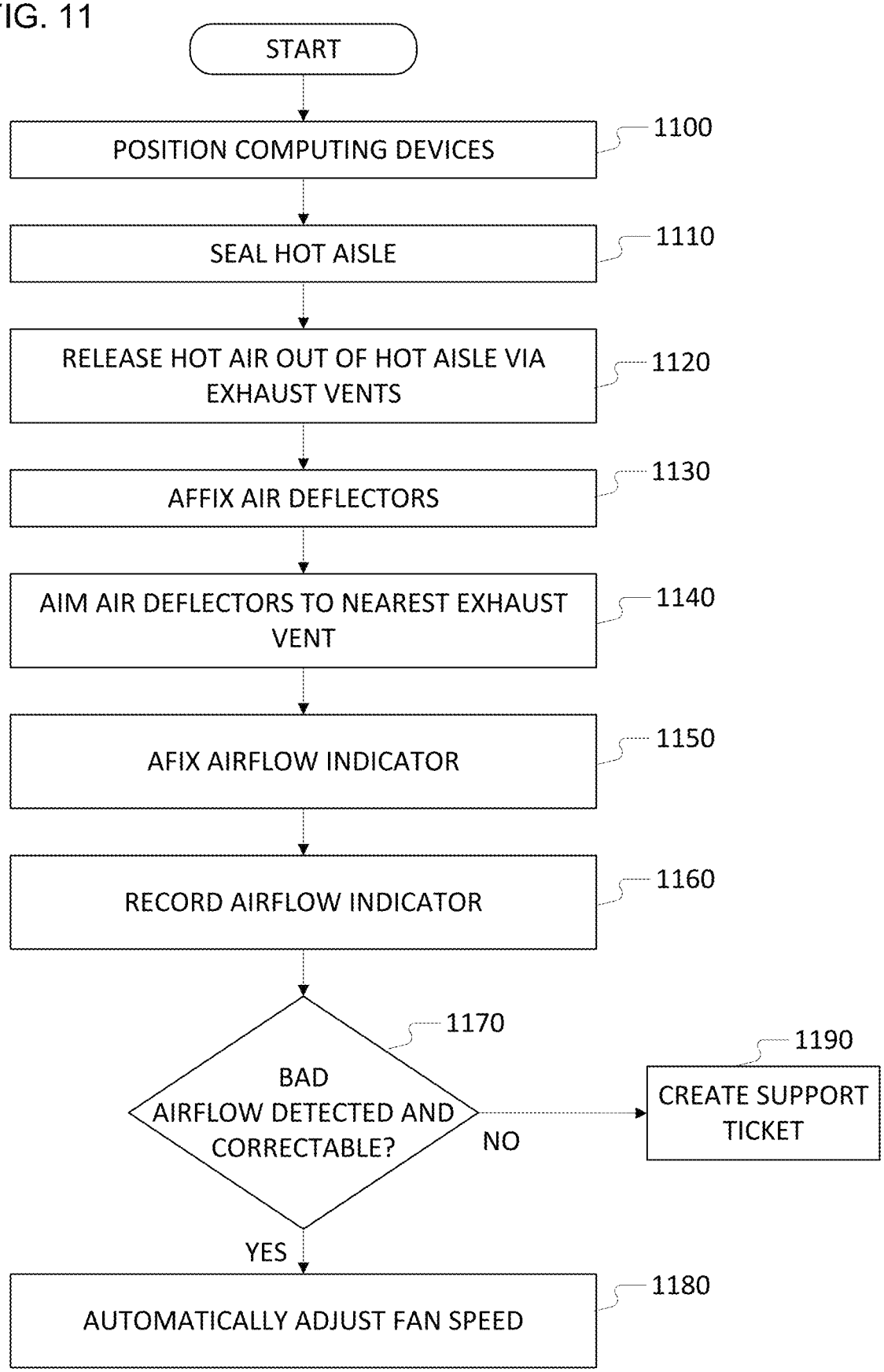
FIG. 11 is a flowchart of an example embodiment of a method for cooling computing devices in a data center according to the teachings of the present disclosure.

Turning now to FIG. 11, one embodiment of a method for cooling computing devices in a data center is shown. In this embodiment, the computing devices are positioned on racks (step 1100) so that they all draw in air from a cold aisle and exhaust their waste heat into a hot aisle that is sealed (step 1110) to prevent hot air from escaping back into the cold aisle. The hot air that collects under pressure in the hot aisle is released via one or more exhaust vents (step 1120). Air deflectors may be affixed (e.g. directly to the computing devices or to hot aisle surfaces) (step 1130) and aimed to assist in directing the exhaust air from the computing devices to the nearest exhaust vent (step 1140).

An airflow indicator such as a flag or electronic airflow sensor may be affixed (step 1150) to enable the recording of airflow (step 1160). If a problematic airflow is detected (step 1170), e.g., the streamers are not pointing in the desired direction such as toward the nearest exhaust vent, or they are not fluttering at the desire frequency, and the problem can be corrected by adjusting the fan speed of the computing devices, those adjustments are made (step 1180). If they are not correctable, a support ticket may be automatically created to inform data center staff of the problem (step 1190).

Figure 12:
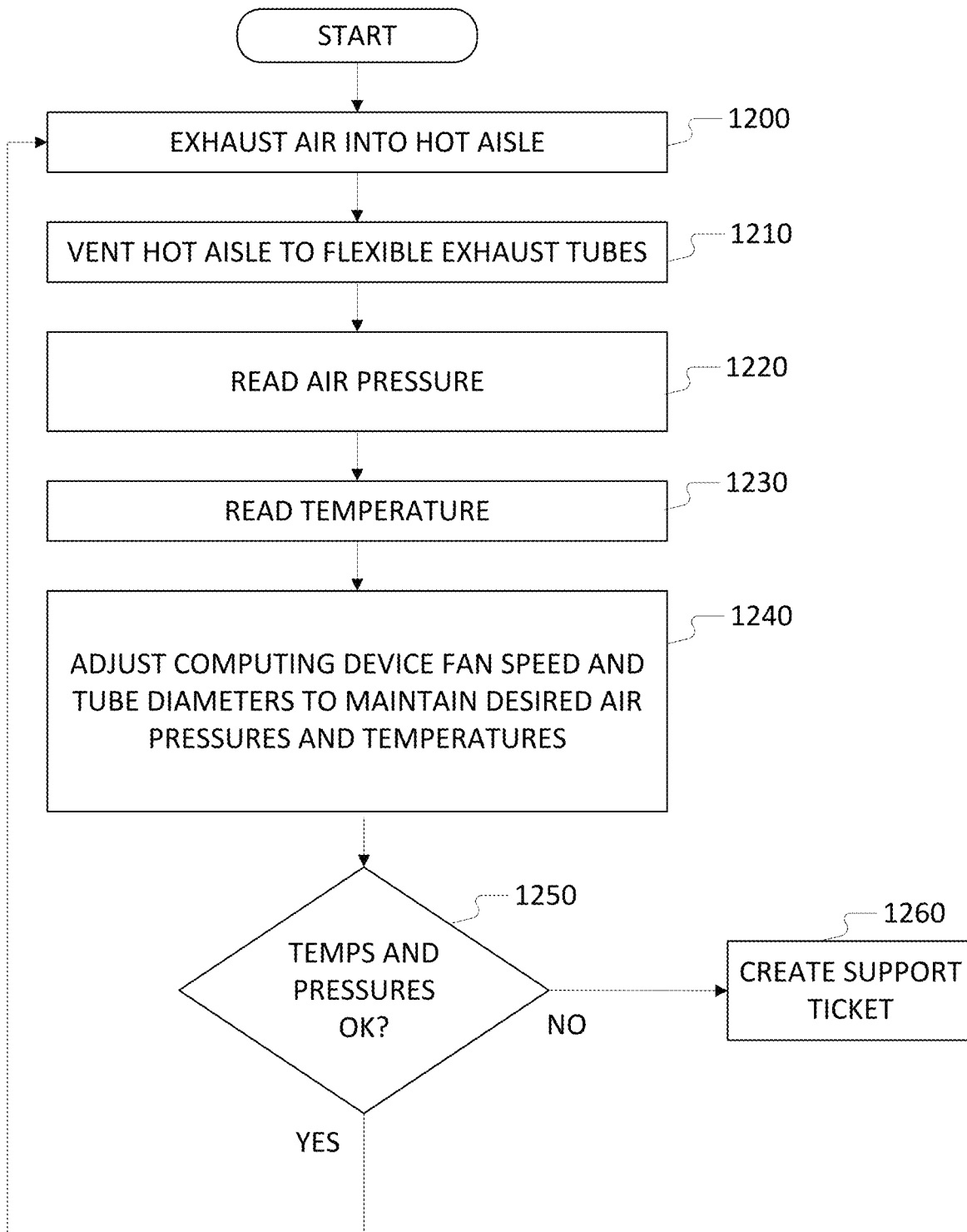
FIG. 12 is a flowchart of an example embodiment of a method for cooling computing devices in a data center according to the teachings of the present disclosure.

Turning now to FIG. 12, one embodiment of another method for cooling computing devices in a data center is shown. In this embodiment, the computing devices are also positioned on racks so that they all draw in air from a cold aisle and exhaust their waste heat into a hot aisle (step 1200) that is sealed to prevent hot air from escaping back into the cold aisle. The hot air in the hot aisle is vented to a number of flexible exhaust tubes (step 1210). The air pressure in or near the tubes is read (step 1220), and the temperature in one or more locations around the data center is also read (step 1230). The computing devices' fan speeds and the exhaust tubes' diameters are adjusted to maintain air pressure and temperatures within a desired range (step 1240). The temperatures and pressures are periodically monitored to determine whether they are in acceptable ranges (step 1250). If the changes cannot bring the temperatures and air pressures into the desired range, a support ticket may be created (step 1260).

Reference throughout the specification to "various embodiments," "with embodiments," "in embodiments," or "an embodiment," or the like, means that a particular feature, structure, or characteristic described in connection with the embodiment is included in at least one embodiment. Thus, appearances of the phrases "in various embodiments," "with embodiments," "in embodiments," or "an embodiment," or the like, in places throughout the specification are not necessarily all referring to the same embodiment. Furthermore, the particular features, structures, or characteristics may be combined in any suitable manner in one or more embodiments. Thus, the particular features, structures, or characteristics illustrated or described in connection with one embodiment/example may be combined, in whole or in part, with the features, structures, functions, and/or characteristics of one or more other embodiments/examples without limitation given that such combination is not illogical or non-functional. Moreover, many modifications may be made to adapt a particular situation or material to the teachings of the present disclosure without departing from the scope thereof.

It should be understood that references to a single element are not necessarily so limited and may include one or more of such elements. Any directional references (e.g., plus, minus, upper, lower, upward, downward, left, right, leftward, rightward, top, bottom, above, below, vertical, horizontal, clockwise, and counterclockwise) are only used for identification purposes to aid the reader's understanding of the present disclosure, and do not create limitations, particularly as to the position, orientation, or use of embodiments.

Joinder references (e.g., attached, coupled, connected, and the like) are to be construed broadly and may include intermediate members between a connection of elements and relative movement between elements. As such, joinder references do not necessarily imply that two elements are directly connected/coupled and in fixed relation to each other. The use of "e.g." and "for example" in the specification is to be construed broadly and is used to provide non-limiting examples of embodiments of the disclosure, and the disclosure is not limited to such examples. Uses of "and" and "or" are to be construed broadly (e.g., to be treated as "and/or"). For example, and without limitation, uses of "and" do not necessarily require all elements or features listed, and uses of "or" are inclusive unless such a construction would be illogical.

While processes, systems, and methods may be described herein in connection with one or more steps in a particular sequence, it should be understood that such methods may be practiced with the steps in a different order, with certain steps performed simultaneously, with additional steps, and/or with certain described steps omitted.

All matter contained in the above description or shown in the accompanying drawings shall be interpreted as illustrative only and not limiting. Changes in detail or structure may be made without departing from the present disclosure.

It should be understood that a computer, a system, and/or a processor as described herein may include a conventional processing apparatus known in the art, which may be capable of executing preprogrammed instructions stored in an associated memory, all performing in accordance with the functionality described herein. To the extent that the methods described herein are embodied in software, the resulting software can be stored in an associated memory and can also constitute means for performing such methods. Such a system or processor may further be of the type having ROM, RAM, RAM and ROM, and/or a combination of non-volatile and volatile memory so that any software may be stored and yet allow storage and processing of dynamically produced data and/or signals.

It should be further understood that an article of manufacture in accordance with this disclosure may include a non-transitory computer-readable storage medium having a computer program encoded thereon for implementing logic and other functionality described herein. The computer program may include code to perform one or more of the methods disclosed herein. Such embodiments may be configured to execute via one or more processors, such as multiple processors that are integrated into a single system or are distributed over and connected together through a communications network, and the communications network may be wired and/or wireless. Code for implementing one or more of the features described in connection with one or more embodiments may, when executed by a processor, cause a plurality of transistors to change from a first state to a second state. A specific pattern of change (e.g., which transistors change state and which transistors do not), may be dictated, at least partially, by the logic and/or code.

What is claimed is:

1. A data center for operating computing devices comprising:
    a set of external walls;
    a ceiling connected to the external walls, wherein the ceiling comprises a plurality of circular ceiling openings;
    a pod positioned within the external walls and below the ceiling; wherein the pod supports a plurality of computing devices that are positioned to vent exhaust air into a hot aisle formed by a plurality of air barriers, wherein the hot aisle comprises a plurality of circular pod exhaust openings;
    a plurality of flexible fabric tubes each connecting one of the circular pod exhaust openings to the circular ceiling openings; and
    a plurality of covers, wherein each cover is connected to one end of one of the flexible fabric tubes, wherein the plurality of covers are configured to deflect rainwater from entering the flexible fabric tubes while permitting exhaust air to escape.

2. The data center of claim 1, wherein each of the computing devices are positioned at a horizontal and vertical angle relative to perpendicular from a nearest one of the air barriers to direct exhaust to a nearest one of the pod exhaust openings.

3. The data center of claim 1, further comprising a plurality of actuating closures, wherein each actuating closure is connected to one of the flexible fabric tubes and controls airflow through the flexible fabric tubes.

4. The data center of claim 3, further comprising one or more air pressure sensors inside one or more of the flexible fabric tubes.

5. The data center of claim 4, further comprising a controller configured to receive air pressure data from the air pressure sensors and adjust the actuating closures to maintain a desired air pressure.

6. The data center of claim 1, further comprising a mesh sealing one end of each of the flexible fabric tubes.

7. The data center of claim 1, wherein the circular ceiling openings and the circular pod exhaust openings are each arranged in a two-dimensional array.

8. The data center of claim 1, wherein the circular ceiling openings and the circular pod exhaust openings are each arranged in an offset two-dimensional array.

9. A data center for operating computing devices, comprising:
    a set of external walls;
    a ceiling connected to the external walls, wherein the ceiling comprises a plurality of circular ceiling openings;
    a pod positioned within the external walls and below the ceiling; wherein the pod supports a plurality of computing devices that are positioned to vent exhaust air into a hot aisle formed by a plurality of air barriers, wherein the hot aisle comprises a plurality of circular pod exhaust openings;

a plurality of flexible fabric tubes each connecting one of the circular pod exhaust openings to the circular ceiling openings; and a plurality of drain pipes, wherein each drain pipe is connected to one of the flexible fabric tubes, wherein each of the drain pipes is positioned to capture and drain out water that enters the flexible fabric tubes.

10. A data center for operating computing devices comprising:

a set of external walls;

a ceiling connected to the external walls, wherein the ceiling comprises a plurality of circular openings;

a pod positioned within the external walls and below the ceiling; wherein the pod supports a plurality of computing devices that are positioned to vent exhaust air into a hot aisle formed by a plurality of air barriers, wherein the hot aisle comprises a plurality of device openings that permit the computing devices to exhaust hot air into the hot aisle;

a plurality of circular pod exhaust openings that permit air to exit the hot aisle;

a plurality of flexible tubes each connecting one of the circular pod exhaust openings to the circular openings; and an airflow guide having two curved surfaces each facing the plurality of computing devices to facilitate directing the exhaust air into the plurality of flexible fabric tubes.

11. The data center of claim 10, wherein the airflow guide is movable and separable into two halves that are stackable.

12. The data center of claim 10, further comprising a network-enabled airflow sensor.

13. The data center of claim 10, further comprising an airflow indicator.

14. The data center of claim 13, wherein the airflow indicator comprises a streamer.

15. The data center of claim 14, further comprising a camera positioned to record the airflow indicator.

16. The data center of claim 10, further comprising a plurality of airflow indicators, wherein at least one of the airflow indicators is attached to each of the curved surfaces.

17. The data center of claim 10, wherein each of the computing devices are positioned at a horizontal angle relative to perpendicular from the nearest one of the air barriers, wherein the horizontal angle directs exhaust to the nearest one of the plurality of flexible tubes.

18. The data center of claim 10, wherein each of the computing devices are positioned at a vertical angle relative to perpendicular from the nearest one of the air barriers to direct exhaust to the nearest one of the plurality of flexible tubes.

19. The data center of claim 10, wherein each of the computing devices are positioned at a horizontal and vertical angle relative to perpendicular from the nearest one of the air barriers to direct exhaust to the nearest one of the plurality of flexible tubes.

20. A data center for operating computing devices comprising:

a set of external walls;

a ceiling connected to the external walls, wherein the ceiling comprises a plurality of circular ceiling openings;

a pod positioned within the external walls and below the ceiling; wherein the pod supports a plurality of computing devices that are positioned to vent exhaust air into a hot aisle formed by a plurality of air barriers, wherein the hot aisle comprises a plurality of circular pod exhaust openings;

a plurality of flexible fabric tubes each connecting one of the circular pod exhaust openings to the circular ceiling openings; and wherein the circular ceiling openings and the circular pod exhaust openings are each arranged in an offset two-dimensional array.

* * * * *